United States Patent
Zhao et al.

(10) Patent No.: US 9,021,685 B2
(45) Date of Patent: May 5, 2015

(54) TWO STEP ANNEALING PROCESS FOR TMR DEVICE WITH AMORPHOUS FREE LAYER

(75) Inventors: Tong Zhao, Fremont, CA (US); Hui-Chuan Wang, Pleasanton, CA (US); Kunliang Zhang, Fremont, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1404 days.

(21) Appl. No.: 12/075,605

(22) Filed: Mar. 12, 2008

(65) Prior Publication Data
US 2009/0229111 A1 Sep. 17, 2009

(51) Int. Cl.
| | |
|---|---|
| G11B 5/127 | (2006.01) |
| G11B 5/39 | (2006.01) |
| B82Y 10/00 | (2011.01) |
| B82Y 25/00 | (2011.01) |
| G01R 33/09 | (2006.01) |
| G11B 5/31 | (2006.01) |
| G11C 11/16 | (2006.01) |
| H01L 43/12 | (2006.01) |

(52) U.S. Cl.
CPC .............. *G11B 5/3909* (2013.01); *B82Y 10/00* (2013.01); *B82Y 25/00* (2013.01); *G01R 33/098* (2013.01); *G11B 5/3163* (2013.01); *G11B 5/3906* (2013.01); *G11C 11/16* (2013.01); *H01L 43/12* (2013.01)

(58) Field of Classification Search
USPC ....................................... 148/516; 29/603.08
See application file for complete search history.

(56) References Cited

U.S. PATENT DOCUMENTS

| | | |
|---|---|---|
| 6,841,395 B2 | 1/2005 | Linn et al. |
| 2006/0255383 A1 | 11/2006 | Kaiser et al. |
| 2007/0012952 A1 | 1/2007 | Guo et al. |
| 2007/0015293 A1 | 1/2007 | Wang et al. |
| 2007/0063237 A1 | 3/2007 | Huai et al. |
| 2007/0111332 A1 | 5/2007 | Zhao et al. |
| 2007/0176251 A1 | 8/2007 | Oh et al. |
| 2007/0263429 A1 | 11/2007 | Yamamoto et al. |

OTHER PUBLICATIONS

"Giant room-temperature magnetoresistance in single-crystal Fe/MgO/Fe magnetic tunnel junctions," by Yuasa et al., Natuare Materials, vol. 3, Dec. 2004, pp. 868-871.

(Continued)

*Primary Examiner* — Rebecca Lee
(74) *Attorney, Agent, or Firm* — Saile Ackerman LLC; Stephen B. Ackerman

(57) ABSTRACT

An annealing process for a TMR or GMR sensor having an amorphous free layer is disclosed and employs at least two annealing steps. A first anneal at a temperature T1 of 200° C. to 270° C. and for a t1 of 0.5 to 15 hours is employed to develop the pinning in the AFM and pinned layers. A second anneal at a temperature T2 of 260° C. to 400° C. where T2>T1 and t1>t2 is used to crystallize the amorphous free layer and complete the pinning. An applied magnetic field of about 8000 Oe is used during both anneal steps. The mechanism for forming a sensor with high MR and robust pinning may involve structural change in the tunnel barrier or at an interface between two of the layers in the spin valve stack. A MgO tunnel barrier and a CoFe/CoB free layer are preferred.

10 Claims, 2 Drawing Sheets

(56) References Cited

OTHER PUBLICATIONS

"Giant tunnelling magnetoresistance at room temperature with MgO (100) tunnel barriers," by Parkin et al., Nature Materials, vol. 3, Dec. 2004, pp. 862-867.

"Giant tunneling magnetoresistance up to 410% at room temperature in fully epitaxial Co/MgO/Co magnetic tunnel junctions with bcc Co(001) electrodes," by Yuasa et al., Applied Physics Letters 89, 042505 (2006), pp. 1-3.

"230% room-temperature magnetoresistance in CoFeB/MgO/CoFeB magnetic tunnel junctions," by Djayaprawira et al., Applied Physics Letters 86, 092502 (2005), pp. 1-3.

"Giant tunneling magnetoresistance effect in low-resistance CoFeB/MgO(001)/CoFeB magnetic tunnel junctions for read-head applications," by Tsnekawa et al., Applied Phusics Letters 87, 072503 (2005), pp. 1-3.

"Ultralow resistance-area product of 0.4 ohms (um)sq. and high magnetoresistance above 50% in CoFeB/MgO/CoFeB magnetic tunnel junctions," by Nagamine et al., Applied Physics Letters 89, 162507 (2006), pp. 1-3.

TWO STEP ANNEALING PROCESS FOR TMR DEVICE WITH AMORPHOUS FREE LAYER

RELATED PATENT APPLICATIONS

This application is related to the following: Ser. No. 11/181,176, filing date Jul. 14, 2005; and Ser. No. 11/280,523, filing date Nov. 16, 2005; both assigned to a common assignee, and both are herein incorporated by reference in their entirety.

FIELD OF THE INVENTION

The invention relates to an annealing process for a sensor in a read head that imparts robust pinning and a high magnetoresistive (MR) ratio to magnetic tunnel junction (MTJ) stacks based on a giant magnetoresistive (GMR) or tunneling magnetoresistive (TMR) configuration having an amorphous free layer.

BACKGROUND OF THE INVENTION

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive layer such as copper. A GMR-CPP configuration is more desirable than a GMR-CIP design for ultra-high density applications because a stronger output signal is achieved as the sensor size decreases, and the magnetoresistive (MR) ratio is higher for a CPP structure.

In the TMR stack, the pinned layer may have a synthetic anti-ferromagnetic (SyAF) configuration in which an outer pinned layer is magnetically coupled through a coupling layer to an inner pinned (AP1) layer that contacts the tunnel barrier. The outer pinned (AP2) layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgO based MTJ is a very promising candidate for high frequency recording applications because its tunneling magnetoresistive (TMR) ratio is significantly higher than for MTJs with an AlOx or TiOx tunnel barrier. An MR ratio of ~200% has been achieved at room temperature in epitaxial Fe(001)/MgO(001)/Fe(001) and polycrystalline FeCo(001)/MgO(001)/(Fe$_{70}$CO$_{30}$)$_{80}$B$_{20}$ MTJs as reported by Yuasa et. al in "Giant room-temperature magnetoresistance in single crystal Fe/MgO/Fe magnetic tunnel junctions", Nature Materials 3, 868-871 (2004) and by Parkin et al in "Giant tunneling magnetoresistance at room temperature with MgO (100) tunnel barriers", Nature Materials 3, 862-867 (2004). S. Yuasa et al. also reported in "Giant magnetoresistance up to 410% at room temperature in fully epitaxial Co/MgO/Co magnetic tunnel junctions with bcc Co(001) electrodes", Applied Phys. Letters 89, 042505 (2006) that a TMR ratio as high as 410% at RT can be achieved in a fully epitaxial Fe(001)/Co(001)/MgO(001)/Co structure. In addition, Djayaprawira et. al showed that MTJs having a CoFeB/MgO(001)/CoFeB structure made by conventional sputtering can also have a very high MR ratio (230%) with the advantages of better flexibility and uniformity in "230% room temperature magnetoresistance in CoFeB/MgO/CoFeB magnetic tunnel junctions", Physics Letters 86, 092502 (2005). However, RA values in the MTJs mentioned above are in the range of 240 to 10000 ohm-um$^2$ which is too high for read head applications.

K. Tsunekawa et. al in "Giant tunneling magnetoresistance effect in low resistance CoFeB/MgO(001)/CoFeB magnetic tunnel junctions for read head applications", Applied Physics Letters 87, 072503 (2005) found a reduction in RA by inserting a DC-sputtered metallic Mg layer between a bottom CoFeB layer and RF-sputtered MgO. The Mg layer improves the crystal orientation of the MgO(001) layer when the MgO (001) layer is thin. The MR ratio of CoFeB/Mg/MgO/CoFeB MTJs can reach 138% at RA=2.4 ohm-μm$^2$. The idea of metallic Mg insertion was initially disclosed by Linn in U.S. Pat. No. 6,841,395 to prevent oxidation of the bottom electrode (CoFe) in a CoFe/MgO/NiFe MTJ structure where the MgO tunnel barrier is formed by RF sputtering. Furthermore, a Ta getter pre-sputtering prior to the RF-sputtered MgO layer can achieve a 55% TMR ratio with RA=0.4 ohm-μm$^2$ as reported by Y. Nagamine et al. in "Ultralow resistance-area product of 0.4 ohm-μm$^2$ and high magnetoresistance above 50% in CoFeB/MgO/CoFeB magnetic junctions", Applied Phys. Letters 89, 162507 (2006).

Although a high MR ratio and low RA has been demonstrated in MTJs based on a MgO tunnel barrier, the remaining challenge is to make the free layer magnetically soft (low Hc and low λ) without sacrificing TMR ratio to meet the requirement of high performance read head applications. In order to achieve a smaller Hc but still maintain a high TMR ratio, the industry tends to use CoFeB as the free layer in a TMR sensor. Unfortunately, the magnetostriction (λ) of a CoFeB free layer is considerably greater than the maximum acceptable value of about $5 \times 10^6$ for high density recording applications. A free layer made of a CoFe/NiFe composite has been employed instead of CoFeB because of its low λ and soft magnetic properties as described in US Patent Application 2007/0015293. In related US Patent Application 2007/0111332, a Mg/MgO/Mg barrier layer, CoFe/NiFe free layer, and a low temperature anneal of 250° C. to 300° C. is disclosed. However, when using a CoFe/NiFe free layer, the TMR ratio will degrade.

U.S. Patent Application 2007/0063237 describes a first annealing to set the pinned layer and a second annealing at a lower temperature and lower magnetic field to achieve an offset angle for the free layer magnetization with respect to the pinned layer magnetization direction.

U.S. Patent application 2006/0255383 discuses changes in MTJ resistance and TMR ratio as a function of annealing temperature between RT and 350° C.

In U.S. Patent Application 2007/0012952, an annealing process involving a temperature between 150° C. and 250° C. and a magnetic field from 200 to 2000 Oe is disclosed. U.S. Patent Applications 2007/0263429 and 2007/0176251 teach a higher temperature annealing in the range of 340° C. to 360° C.

It is also known in the art that a CoFe/CoFeB, CoFeB, or CoB free layer is able to achieve high dR/R and low λ with relatively low annealing temperature (<300° C.). However, the magnetic properties of a CoFeB. CoFe/CoFeB, or CoB free layer are very sensitive to the annealing process due to structural change of the amorphous CoFeB and CoB materials during anneal. With high annealing temperature and long annealing time, a high dR/R can be realized because of crystallization of the amorphous CoFeB or CoB layer, especially near the interface with the tunnel barrier. Unfortunately, crystallization of CoFeB or CoB may lead to harder magnetic properties such as high Hc in Co-rich CoFeB or CoB. One must also be concerned about the effect of the annealing temperature on pinning strength in MTJ devices. Therefore, the annealing process for MTJs based on MgO tunnel barriers and amorphous free layers needs further improvement in order to meet all the requirements of a high performance read head.

SUMMARY OF THE INVENTION

One objective of the present invention is to provide an annealing method for a MTJ that will provide a higher dR/R than achieved with conventional annealing processes while maintaining a low RA value.

A second objective of the present invention is to provide an annealing method according to the first objective that achieves robust pinning and a magnetic soft free layer (low Hc and low λ) without compromising dR/R and RA values for the MTJ.

According to one embodiment of the present invention, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The pinned layer preferably has a synthetic anti-parallel (SyAP) structure in which two ferromagnetic layers are separated by a coupling layer as in CoFe/Ru/CoFe. The tunnel barrier layer is preferably made of MgO and is formed by depositing a first Mg layer on the pinned layer followed by a natural oxidation process on the first Mg layer to form a MgO layer and then depositing a second Mg layer on the MgO layer. The free layer may be comprised of an amorphous material such as CoFeB, CoFe/CoB, or CoFe/CoFeB.

In a second embodiment, the MTJ is replaced by a spin valve structure that is a GMR-CPP or a GMR-CIP sensor having a configuration represented by seed layer/AFM/SyAP pinned/spacer/free/cap wherein the spacer is comprised of Cu or may have a confining current pathway (CCP) configuration represented by Cu/CCP/Cu.

In both embodiments, the MTJ or spin valve layers are formed on a substrate and preferably in a mainframe that has both sputter deposition chambers and at least one oxidation chamber. Then a first key step in the present invention is to perform a first anneal step at a first temperature of 200° C. to 270° C. and preferably 250° C. and by applying a magnetic field of 1000 to 20000 Oe for 0.5 to 15 hours, and preferably 3 hours in a certain direction that is typically along the easy axis. Thereafter, a second anneal step is performed at a second temperature of 260° C. to 400° C. and preferably 280° C. and by applying a magnetic field of 1000 to 20000 Oe for 0.1 to 3 hours, and preferably 1.5 hours, in the same direction as in the first anneal step. It is important that the second temperature is higher than the first temperature and the second anneal time is shorter than the first anneal step so that a low Hc established during the first anneal can be maintained while the crystallization of amorphous material in the free layer is completed at the higher temperature step. Moreover, the first anneal is primarily employed to develop a pinned magnetic state in the AFM and SyAP pinned layers. The MTJ stack is patterned by a conventional method once the two step anneal sequence is completed. After the MTJ element is patterned, an insulation layer is formed on the substrate and surrounding the MTJ and with a top surface that is coplanar with the cap layer in the MTJ. A top shield may then be formed on the insulation layer and on the cap layer.

The dual annealing concept also encompasses embodiments wherein the improvement in dR/R ratio is not caused by free layer crystallization but through other mechanisms such as structure change inside the tunnel barrier or at interfaces during the high temperature anneal step.

DETAILED DESCRIPTION OF THE INVENTION

The present invention is a two step anneal method for improving dR/R and achieving robust pinning strength in MTJ and spin valve elements without compromising magnetic softness in the free layer. Although the exemplary embodiment depicts a TMR sensor in a read head, the method of the present invention may also be applied during the fabrication of GMR-CPP and GMR-CIP sensors, and for making spin valves in STT-RAM devices. The TMR and GMR sensors described herein may have a bottom spin valve, top spin valve, or multilayer spin value configuration as appreciated by those skilled in the art. Drawings are provided by way of example and are not intended to limit the scope of the invention.

Figure 1:
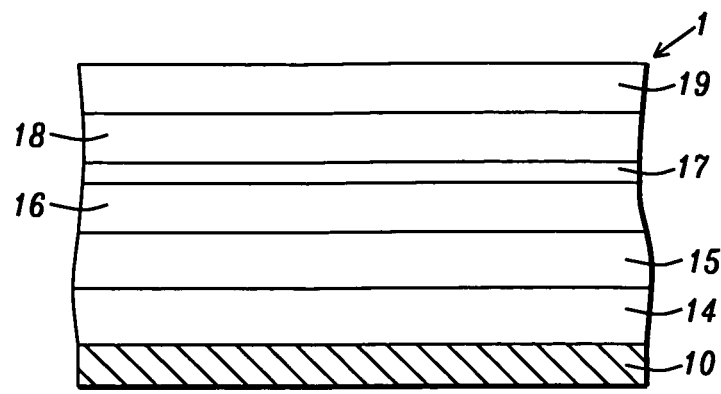
FIG. 1 is a cross-sectional view showing a TMR stack of layers according to one embodiment of the present invention.

Referring to FIG. 1, a portion of a partially formed TMR sensor 1 is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example.

A MTJ stack is formed on the substrate 10 and in the exemplary embodiment has a bottom spin valve configuration wherein a seed layer 14, AFM layer 15, pinned layer 16, tunnel barrier layer 17, free layer 18, and capping layer 19 are sequentially formed on the substrate. The seed layer 14 is preferably comprised of a Ta/Ru composite but Ta, Ta/NiCr, Ta/Cu, Ta/Cr or other seed layer configurations may be employed, instead. The seed layer 14 serves to promote a smooth and uniform grain structure in overlying MTJ layers. Above the seed layer 14 is an AFM layer 15 used to pin the magnetization direction of the overlying pinned layer 16, and in particular, the outer portion or AP2 layer (not shown). The AFM layer 15 is preferably comprised of IrMn. Optionally, one of PtMn, NiMn, OsMn, RuMn, RhMn, PdMn, RuRhMn, or MnPtPd may be employed as the AFM layer.

The pinned layer 16 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 15 and may be made of CoFe. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is comprised of Ru with a thickness from 3 to 9 Angstroms, and preferably 7.5 Angstroms. The AP1 layer is also referred to as the inner pinned layer and may be a single layer such as CoFe or a composite layer. For example, the AP1 layer may have a CoFe/CoFeB, CoFeB/CoFe, or CoFe/CoFeB/CoFe configuration wherein the CoFeB layer is amorphous in order to provide a smoother AP1 top surface on which to form the tunnel barrier layer 17.

In the exemplary embodiment that features a bottom spin valve configuration, the tunnel barrier layer 17 is comprised of MgO because a MgO tunnel barrier is known to provide a higher TMR ratio than a TMR stack made with an AlOx or TiOx tunnel barrier. The MgO tunnel barrier layer is preferably formed by depositing a first Mg layer having a thickness between 4 and 14 Angstroms on the pinned layer 16, oxidizing the Mg layer with a natural oxidation (NOX) process, and then depositing a second Mg layer with a thickness of 2 to 8 Angstroms on the oxidized first Mg layer. Thus, the tunnel barrier is considered as having a Mg/MgO/Mg or MgO/Mg configuration depending on the extent of the oxidation process. The second Mg layer serves to protect the subsequently deposited free layer from oxidation. It is believed that excessive oxygen accumulates at the top surface of the MgO layer as a result of the NOX process and this oxygen can oxidize a free layer that is formed directly on the MgO portion of the tunnel barrier layer and thereby undesirably reduce the MR ratio for the device. Note that the RA and MR ratio for the TMR sensor may be adjusted by varying the thickness of the two Mg layers in tunnel barrier layer 17 and by varying the natural oxidation time and pressure. It should be understood that a radical oxidation (ROX) method of forming a MgO barrier is possible but is not favored when a low RA value of less than about 20 ohm-$\mu m^2$ is desired.

All layers in the TMR stack may be deposited in a DC sputtering chamber of a mainframe such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $1 \times 10^{-9}$ torr. A lower pressure enables more uniform films to be deposited.

The NOX process may be performed in an oxidation chamber within the sputter deposition system by applying an oxygen pressure of 0.01 mTorr to 1 Torr for about 10 to 600 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA in the range of 0.5 to 5 ohm-$um^2$. A mixture of $O_2$ with other inert gases such as Ar, Kr, or Xe may also be used for better control of the oxidation process.

The present invention anticipates that a MgO tunnel barrier layer 17 could be formed by depositing a MgO layer on pinned layer 16 with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when a MgO tunnel barrier layer is rf-sputtered and less than 3% when a MgO tunnel barrier is formed by DC sputtering a Mg layer followed by a NOX process.

In an alternative embodiment, the tunnel barrier 17 may be comprised of MgZnO, ZnO, $Al_2O_3$, TiOx, TiAlOx, HfOx, ZrOx, or any combination of the aforementioned materials. Furthermore, one or more of the aforementioned oxide layers may be used with MgO in a composite tunnel barrier layer 17.

The free layer 18 formed on the tunnel barrier layer 17 may be a single layer such as $Co_ZFe_XB_Y$ where x is 0 to about 90 atomic %, y is from 10 atomic % to 40 atomic %, and x+y+z=100 atomic %. The free layer 18 may have a bilayer configuration represented by CoFe/CoB or $Co_ZFe_{(100-Z)}$/$CoFe_XB_Y$ where z is 0 to 100 atomic %, or may have a multilayer structure comprised of at least one CoFeB or CoNiFeB layer. Optionally, CoFe may be replaced by CoNiFe and CoFeB may be replaced by CoNiFeB in the aforementioned configurations. Note that the present invention encompasses a free layer structure where x=0 which is a low magnetostriction $CoB_Y$ layer where y is from about 10 to 30 atomic %, λ is preferably between $-5 \times 10^{-6}$ and 0, and the total atomic % for the two elements is 100 atomic %. In yet another embodiment, the free layer 18 may include one or more layers made of CoFe, CoFeB, CoB, FeB, CoNiFe, CoNiFeB, or alloys thereof wherein the B content is at least 10 atomic %. Those skilled in the art will appreciate that a CoB layer with a small negative magnetostriction between $-5 \times 10^{-6}$ and 0 may be combined with one or more of the aforementioned free layers having a small positive magnetostriction between 0 and $5 \times 10^{-6}$ to achieve a net magnetostriction near zero and still maintain low Hc (<6 Oe) and low RA values necessary for high performance TMR sensors.

The capping layer 19 formed on the free layer 18 may be comprised of Ru, Ru/Ta, Ta, Ru/Ta/Ru, or other capping layers used in the art. In the example where a Ru/Ta capping layer is used, the upper Ta layer serves as a hard mask during a subsequent chemical mechanical polishing (CMP) step in order to prevent excessive erosion on the Ru capping layer.

In a GMR-CPP sensor embodiment (not shown), a similar stack of spin valve layers as shown in FIG. 1 may be formed on a substrate except the tunnel barrier layer 17 is replaced with a conductive spacer made of Cu, for example. Furthermore, the spacer may have a current confining path (CCP) configuration represented by Cu/CCP/Cu where the current through the Cu spacer is limited by the means of segregating metal path and oxide formation in the CCP portion of the spacer.

Figure 5:
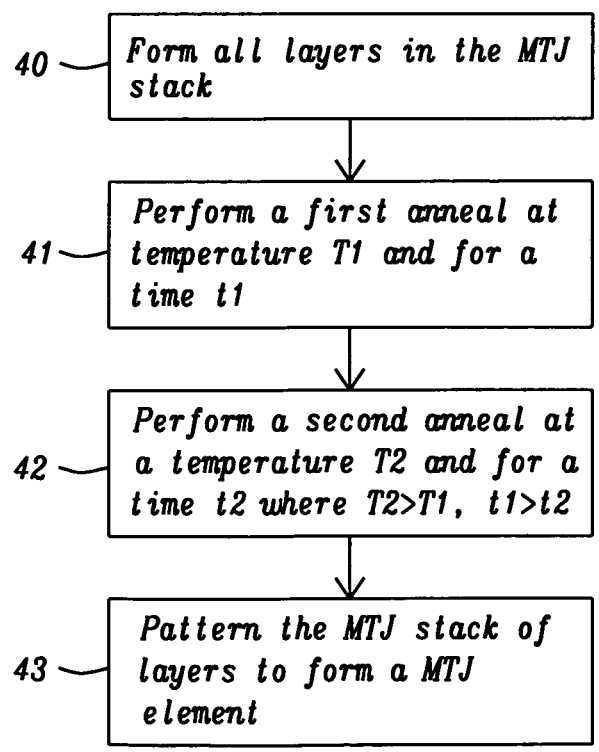
FIG. 5 is a flow chart that depicts how a double anneal process is used during the fabrication of a TMR read head according to one embodiment of the present invention.

In all embodiments of the present invention including TMR, GMR-CPP, and GMR-CIP sensor fabrication sequences, a key feature is that the partially formed read head 1 is subjected to a two step anneal process as outlined in FIG. 5. The first step 40 includes forming all layers in the TMR, GMR-CPP, or GMR-CIP sensor as previously described. In a preferred embodiment, the first anneal step 41 is performed in a vacuum oven outside the sputter deposition mainframe and is comprised of a temperature T1 from 200° C. to 270° C. for a time t1 of 0.5 to 15 hours with an applied magnetic field of at least 1000 Oe along the desired pinning direction, and preferably 250° C. for 3 hours at 8000 Oe. During step 41, the AFM layer 15 and pinned layer 16 magnetization is essentially pinned along a certain direction but the free layer 18 retains some or all of its amorphous content when amorphous layers are included as in the preferred embodiments.

In step 42, a second anneal step is performed and may occur in the same vacuum oven as the first step 41. Step 42 is comprised of a temperature T2 between 260° C. and 400° C. for a time t2 of 0.1 to 3 hours with an applied magnetic field of 1000 to 20000 Oe along the desired pinning direction, and preferably 280° C. for 3 hours at 8000 Oe. When the same vacuum oven is employed for both anneals and the temperature is ramped from T1 to T2 while the substrate is in the oven, the ramp time is typically only 5 to 10 minutes and is not included in either t1 or t2. However, an important requirement is that T2>T1 and t1>t2. The higher temperature of step 42 is employed to convert the one or more amorphous layers in the free layer 18 to a crystalline state that provides a higher MR ratio. On the other hand, the time t2 is minimized to prevent a high Hc in the free layer. Preferably, the magnetic field during the second anneal step is applied along the desired pinning direction that was selected for the first anneal step.

Alternatively, the second anneal may be performed in a second vacuum oven and the substrate may be cooled to about room temperature between the first anneal and second anneal step. It should be understood that under certain conditions, depending upon the time and temperature involved in the anneal steps 41, 42, the tunnel barrier layer 17 may become a uniform MgO tunnel barrier layer as unreacted oxygen diffuses into the Mg layer which contacts the free layer 18.

In an alternative embodiment, a third anneal step (not shown) may be added after the second anneal step 42 and prior to patterning the TMR stack in step 43. The third anneal step may be employed to set the easy direction for the free layer, for example, and may be comprised of a temperature of 180° C. to 220° C. for 1 to 5 hours with an applied magnetic field of 200 to 1000 Oe.

Figure 2:
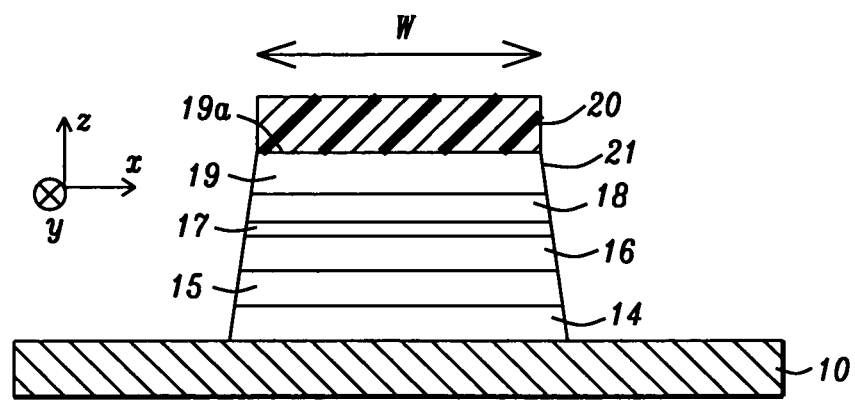
FIG. 2 is a cross-sectional view showing a TMR stack of layers that has been patterned to form a MTJ element during an intermediate step of fabricating the TMR sensor according to one embodiment of the present invention.

During step 43, the TMR stack is patterned by following a conventional process sequence. Referring to FIG. 2, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process stops on the bottom shield 10 or between the bottom shield and a barrier layer (not shown) to give a TMR sensor with a top surface 19a and sidewalls 21.

Figure 3:
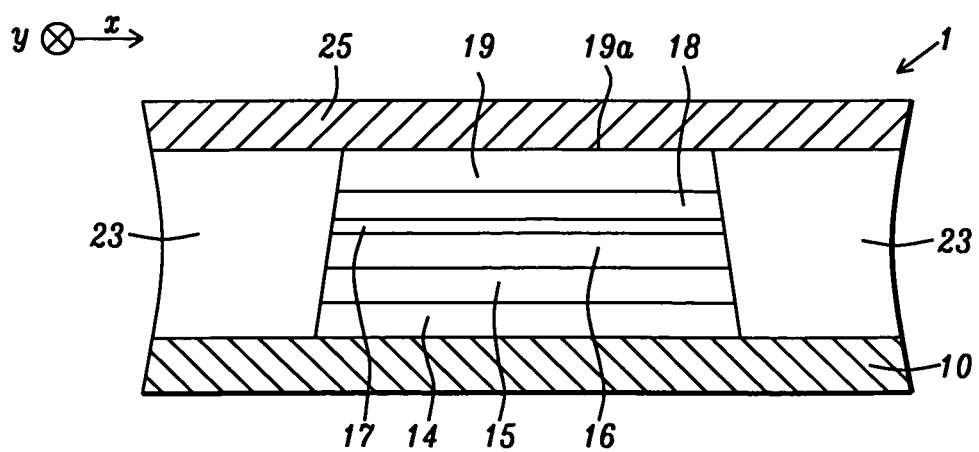
FIG. 3 is a cross-sectional view of a TMR read head having a MTJ element interposed between a top shield and bottom shield and formed according to an embodiment of the present invention.

Referring to FIG. 3 that represents a TMR sensor embodiment, an insulating layer 22 may be deposited along the sidewalls 21. The photoresist layer 20 is then removed by a lift off process, for example. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) disposed on the top shield 25.

In a GMR-CPP or GMR-CIP embodiment (not shown), the sequence of steps 40-43 is followed. Once the sensor element is formed by a conventional patterning and etching sequence, a first insulation layer may be formed along the sidewalls 21 and on the substrate 10. Then a hard bias layer is deposited on the first insulation layer followed by deposition of a second insulation layer on the hard bias layer. Thereafter, the second insulation layer is planarized and a top shield is formed on the capping layer and second insulation layer as understood by those skilled in the art.

Figure 4:
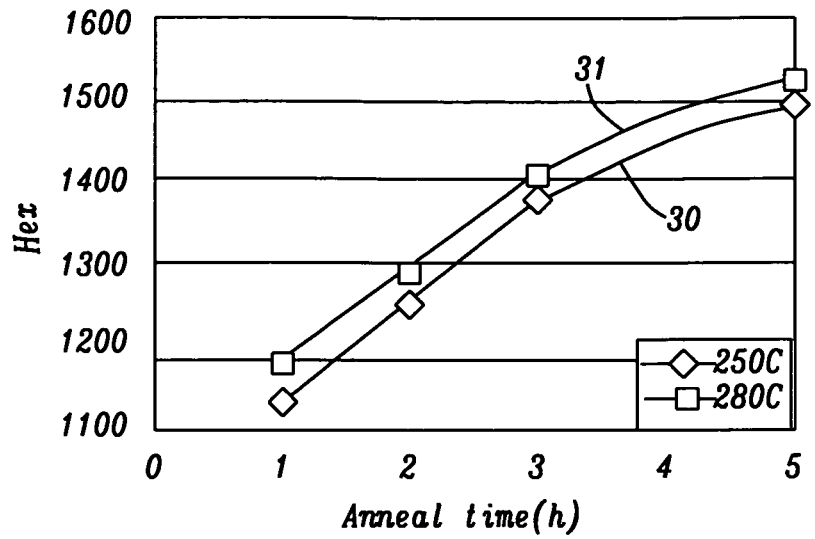
FIG. 4 is a graph that illustrates how Hex increases with longer anneal times at two different temperatures according to an embodiment of the present invention.

Referring to FIG. 4, the effect of annealing condition on pinning strength Hex is depicted. An AFM material must be annealed at a certain temperature for a certain period of time to develop a strong and clean pinning through grain growth and atomic rearrangement at the AFM/pinned layer interface. Note that for both 250° C. and 280° C. anneal temperatures, Hex increases with annealing time and Hex for a 1.5 hour anneal is significantly smaller than that after a 5 hour anneal. Comparing 280° C. at 1.5 hours with 250° C. at 5 hours, one observes that if the anneal time is too short, the loss of Hex cannot be compensated by a higher anneal temperature. The small Hex difference between 250° C. and 280° C. indicates that 250° C. is acceptable for developing good pinning strength during anneal.

Comparative Example 1

An experiment was conducted to determine the effect of annealing conditions on dR/R and Hc in TMR stack comprised of an amorphous free layer. We have demonstrated that an improved overall performance with regard to Hc, λ, dR/R, and RA is achieved by implementing a two step anneal process according to the present invention. A TMR stack of layers, hereafter referred to as MTJ 1 and shown in Table 1, was fabricated as a reference and is comprised of a conventional CoFe/NiFe free layer wherein the lower CoFe layer is 10 Angstroms thick and the upper NiFe layer is 40 Angstroms thick. All MTJs in Table 1 have a seed/AFM/AP2/Ru/AP1/MgO/free layer/capping layer configuration with thicknesses in Angstroms of the seed layer, AFM layer, and capping layer, respectively, given in parentheses: Ta(20)/Ru(20); IrMn(70); and Ru(10)/Ta(60). The pinned layer has an AP2/Ru/AP1 structure in which the AP2 layer is a 25 Angstrom thick $CO_{70}Fe_{30}$ layer, the Ru coupling layer has a 7.5 Angstrom thickness, and the AP1 layer is a 25 Angstrom thick $CO_{70}Fe_{30}$ layer. The MgO tunnel barrier was formed by depositing a 7 Angstrom thick lower Mg layer that was subjected to a NOX process before a 3 Angstrom thick upper Mg layer was deposited.

TABLE 1

Magnetic properties of Ta/Ru/IrMn/CoFe/Ru/CoFe/MgO/FL/cap structure and dR/R of 0.8 μm device with different annealing conditions using an 8000 Oe applied field

| MTJ | Free Layer (FL) | 1st Anneal | 2nd Anneal | Hc (Oe) | Lambda | RA (device) | dR/R (device) |
|---|---|---|---|---|---|---|---|
| 1 | FeCo/NiFe (reference) | 250 C. (or 280 C.), 5 hr | N/A | 4.2 | $2 \times 10^{-6}$ | 1.9 | 50% |
| 2 | FeCo/CoB | 250 C., 5 hr | N/A | 4.4 | $1 \times 10^{-6}$ | 2.2 | 53% |
| 3 | FeCo/CoB | 280 C., 5 hr | N/A | 7.5 | $1 \times 10^{-6}$ | 1.9 | 61% |
| 4 | FeCo/CoB | 280 C., 1.5 hr | N/A | 4.4 | $1 \times 10^{-6}$ | 1.8 | 60% |
| 5 | FeCo/CoB | 250 C., 3 hr | 280 C., 1.5 hr | 4.5 | $1 \times 10^{-6}$ | 1.8 | 60% |

The TMR stack was formed on a NiFe shield and was annealed under vacuum with an applied field of 8000 Oe. MTJs 2-5 have a lower 4 Angstrom thick $Fe_{70}CO_{30}$ layer and an upper 40 Angstrom thick $CO_{80}B_{20}$ layer. Magnetic properties are shown for 0.8 micron circular devices.

The low dR/R and low Hc for MTJ 2 in Table 1 implies that a 250° C. anneal is not high enough to induce crystallization of CoB. According to this experiment, we selected an anneal process comprised of a first anneal at a relatively low temperature of 250° C. for a time t1 of about 3 hours for developing pinning in AFM and AP2 pinned layers only followed by a second anneal at a higher T2 of about 280° C. for shorter t2 of 1.5 hours to complete the crystallization of the CoB layer and further develop pinning in the AFM and AP2 layers. Note that an undesirably high Hc in MTJ 3 is obtained if an anneal is performed at 280° C. with a time of about 5 hours. On the other hand, if a 280° C. anneal is performed at a shorter time of about 1.5 hours as in MTJ 4, magnetic properties in Table 1 are acceptable but Hex shown in FIG. 4 is too low. Therefore, MTJ 5 with the two step anneal provides the best overall results since Table 1 magnetic properties for MTJ 5 are equivalent to those of MTJ 4 but a higher Hex will be achieved for MTJ 5. It should be understood that the Hex for MTJ 5 treated with a two step anneal process will be higher than the 1360 Oe shown for the 250° C., 3 hour anneal in FIG. 4 while MTJ 4 has a Hex slightly over 1200 Oe. It is believed that MTJ 5 will have a Hex above 1400 Oe because of an additive effect of two anneal processes. Therefore, Table 1 results together with the data in FIG. 4 demonstrate that a double anneal process as defined herein may be employed to achieve low λ, Hc, and RA values simultaneously with high dR/R and Hex values that have not been observed from a single spin valve in prior art.

The present invention also anticipates that improved magnetic properties including higher MR ratio and more robust pinning may result from other mechanisms besides crystallization of an amorphous layer. For example, structural changes within the tunnel barrier layer or at interfaces between two adjacent layers in the TMR (or GMR) stack may contribute to significant improvement in magnetic properties. Furthermore, the present invention encompasses an embodiment that includes a multistep anneal process wherein a third anneal step with a temperature different than T1 and T2 and an applied field less than that used for the prior two annealing steps may be included.

While this invention has been particularly shown and described with reference to, the preferred embodiment thereof, it will be understood by those skilled in the art that various changes in form and details may be made without departing from the spirit and scope of this invention.

We claim:

1. An annealing process for a spin valve in a magnetic read head, said spin valve is comprised of a plurality of layers including at least one AFM layer and at least one pinned layer, and has a ferromagnetic free layer consisting of one or more of CoFe, CoB, CoFeB, FeB, CoFeNi, and CoNiFeB that includes at least one amorphous layer, comprising:

(a) a first anneal step comprised of applying a first temperature and a magnetic field along a desired pinning direction for a first period of time to pin a magnetization in the at least one AFM layer and at least one pinned layer;

(b) a second anneal step comprised of applying a second temperature and a magnetic field along said desired pinning direction for a second period of time to crystallize the at least one amorphous layer and further develop pinning of the AFM layer and at least one pinned layer in the desired pinning direction and wherein said second temperature is greater than said first temperature and said first period of time is longer than said second period of time; and (c) a third step between the first anneal step and the second anneal step which is a heat treatment of the magnetic read head wherein the first temperature is ramped to the second temperature during a period of 5 to 10 minutes in a chamber that is used for the first and second anneal steps.

2. The annealing process of claim 1 wherein said spin valve is a MTJ element in a TMR sensor or a magnetoresistive element in a GMR-CPP, GMR-CIP sensor, or STT-RAM device.

3. The annealing process of claim 2 wherein the MTJ element includes a tunnel barrier layer comprised of one or more of MgO, MgZnO, ZnO, $Al_2O_3$, TiOx, TiAlOx, HfOx, and ZrOx.

4. The annealing process of claim 3 wherein the free layer is formed on the tunnel barrier layer, said free layer is a single layer consisting of $Co_ZFe_xB_Y$ where x is from 0 to about 90 atomic %, y is about 10 to 40 atomic %, and x+y+z=100 atomic %, or is a bilayer having a $Co_ZFe_{(100-Z)}/Co_ZFe_xB_Y$, CoFe/CoB, CoNiFe/CoFeB, or CoFe/CoNiFeB configuration where z is from 0 to about 100 atomic %, or is a multilayer structure consisting of at least one CoFeB or CoNiFeB layer.

5. The annealing process of claim 1 wherein said magnetic field is from about 1000 to 20000 Oe, said first temperature is between about 200° C. to 270° C., said first time period is from about 0.5 to 15 hours, said second temperature is between about 260° C. and 400° C., and said second time period is from about 0.1 to 3 hours.

6. The annealing process of claim 4 wherein the tunnel barrier layer is comprised of MgO, the free layer is comprised of a CoFe/CoB composite, the first step includes a temperature of about 250° C. for about 3 hours with a magnetic field of about 8000 Oe, and the second step includes a temperature of about 280° C. for about 1.5 hours with a magnetic field of about 8000 Oe.

7. The annealing process of claim 3 wherein the free layer includes one or more layers made of CoFe, CoFeB, CoB, FeB, CoNiFe, or CoNiFeB, wherein the B content is at least 10 atomic %.

8. The annealing process of claim 3 wherein the two step annealing process results in a high MR ratio with robust pinning of the AFM and pinned layers because of a mechanism that involves structural change in the tunnel barrier layer or at an interface between two of the plurality of layers.

9. The annealing process of claim 1 wherein said AFM layer is comprised of IrMn, PtMn, NiMn, OsMn, RuMn, RhMn, PdMn, RuRhMn, or MnPtPd and requires annealing to enhance pinning of the AFM and pinned layers.

10. The annealing process of claim 1 further comprised of a third annealing step after the second annealing step.

* * * * *